United States Patent
Tae et al.

(10) Patent No.: US 6,350,695 B1
(45) Date of Patent: Feb. 26, 2002

(54) PILLAR PROCESS FOR COPPER INTERCONNECT SCHEME

(75) Inventors: Kim Hyun Tae; Kim Hock Ang; Kiok Boone Elgin Quek, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 27 days.

(21) Appl. No.: 09/594,414

(22) Filed: Jun. 16, 2000

(51) Int. Cl.[7] ............................................. H01L 21/311
(52) U.S. Cl. .................... 438/694; 438/700; 438/702
(58) Field of Search ............................. 438/694, 691, 438/692, 700, 702, 706, 720

(56) References Cited

U.S. PATENT DOCUMENTS

| | | | |
|---|---|---|---|
| 5,512,514 A | 4/1996 | Lee | 437/195 |
| 5,691,238 A | 11/1997 | Avanzino et al. | 437/195 |
| 5,693,568 A | 12/1997 | Lia et al. | 437/195 |
| 5,846,876 A | 12/1998 | Bandyopadhyay et al. | 438/622 |
| 6,030,896 A * | 2/2000 | Brown | 438/687 |
| 6,054,389 A * | 4/2000 | Cheng | 438/692 |
| 6,140,238 A * | 10/2000 | Kitch | 438/687 |
| 6,143,638 A * | 11/2000 | Bohr | 438/612 |
| 6,228,770 B1 * | 5/2001 | Pradeep et al. | 438/692 |

* cited by examiner

*Primary Examiner*—Benjamin L. Utech
*Assistant Examiner*—Kin-Chan Chen
(74) *Attorney, Agent, or Firm*—George O. Saile; Rosemary L. S. Pike

(57) ABSTRACT

A method for forming reliable inter-level metal interconnections in semiconductor integrated circuits is described where pillars are formed to connect between different metal layers. A first conductive layer is deposited overlying a substrate. A conductive etch stop layer is deposited overlying the first conductive layer and then patterned to form a mask for the fist conductive layer. This is followed by a deposition of via metal layer overlying the entire surface. A hard mask layer is deposited and patterned to form the mask where via pillars are to be formed. Subsequent anisotropic etching forms pillars in the via met layer and openings in the first conductive layer. An inter-metal dielectric (IMD) layer is deposited covering and filling both the openings in the first conductive layer and in between the via pillars. The surface is then planarized.

24 Claims, 5 Drawing Sheets

PILLAR PROCESS FOR COPPER INTERCONNECT SCHEME

BACKGROUND OF THE INVENTION

(1) Field of the Invention

The invention generally relates to an interconnection process used in semiconductor manufacturing and, more particularly, to a method using pillars to make connections between different layers of metal or conducting material in the fabrication of integrated circuits.

(2) Description of Prior Art

To improve the device speed of logic on sub-quarter micron semiconductor circuits, copper has gained popularity as an interconnect material. This takes advantage of the copper's low electrical resistivity and superior resistance to electro-migration. In order to effectively use copper as a multi-level interconnect, the dual damascene process has been developed and adopted. This process allows use of very fine conductor line widths and spaces. In a damascene process, trenches are formed in an isolation layer. The surface of the wafer is then covered with conductive material. Chemical mechanical polishing (CMP) is used to remove the conductive material not in the trenches and to planarize the surface. Typically, in a dual damascene process, both the conductor trenches and interlevel connecting vias are formed in the isolation layer, and then filled with conductive material.

Referring now to FIG. 1, a dual damascene process is depicted in cross-section. A substrate layer 10 is provided. The substrate layer 10 may contain underlying layers, devices, junctions, and other features covered by an insulating layer formed prior to deposition and patterning of the first conductive traces 12. A conductive etch stop layer 14 is provided overlying the first conductive traces 12. An isolation layer 16 overlies the entire surface.

Referring now to FIG. 2, an anisotropic via etch is performed leaving partially formed via holes 18 in the surface of the isolation layer 16. Referring now to FIG. 3, a second anisotropic etch step is performed creating trenches 20 in the surface of the isolation layer 16. This etch also completes the formation of via holes 18. The conductive etch stop layer 14 prevents the second etch from attacking the first conductive traces 12. The process may alternately etch the via holes 18 to the conductive etch stop layer 14 prior to formation of the trenches 20.

Referring now to FIG. 4, a second conductive layer 22 is applied to the surface of the wafer, fining the via holes 18 and trenches 20. Chemical mechanical polishing (CMP) is used to planarize the surface and expose the top surface of the isolation layer 16, completing the formation of the dual damascene structure.

Using prior techniques, vias can be difficult to etch. Incomplete clearing of etch by-product residue at the bottom of narrow trenches may result in poor or open connections between the via and the conductive etch stop. Problems in filling the fine via openings with the second conductive layer may also result in high resistance via contacts. These problems may be exaggerated by the fact that etch rates increase in areas where via density is higher.

Other approaches improving interconnections exist. U.S. Pat. No. 5,512,514 to Lee teaches a method of using pillars in the creation of vias in multilevel metalization. U.S. Pat. No. 5,691,238 to Avanzino et al teaches a method using a dual and triple damascene process whereby pillars are created to complete interlevel connection. U.S. Pat. No. 5,693,568 to Liu et al. teaches a method using two conductive layers with a conductive etch stop layer between them. First all three layers are selectively etched to form the pattern for the lower conductors. The openings between the conductors are then filled with a dielectric. The upper conductive layer is then patterned and etched to form the interlevel vias. The openings in the upper conductive layer are then filled and the wafer surface covered with dielectric. The surface is planarized exposing the tops of the upper conductive layer. This process is repeated to form multiple levels of interconnection. U.S. Pat. No. 5,846,876 to Bandyapadhyay et al. teaches a method using multiple conductive levels to reduce conductor spacing while avoiding problems of increased capacitance.

SUMMARY OF THE INVENTION

A principal object of the present invention is to provide a process that allows the formation of reliable interlevel conductor connection.

Another object of the present invention is to provide a process of forming multi-level interconnection that avoids complicated cleaning of the via interface required in the conventional metal plug filling process.

Another object of the present invention is to provide a process of forming multi-level interconnection that reduces the number of process steps.

Another object of the present invention is to provide a process of forming multi-level interconnection that circumvents the problem caused by increased etch rate in areas of dense via population.

Yet another object of the present invention is to provide a process of forming multi-level interconnection using copper conductors thereby taking advantage of the low electrical resistivity and superior resistance to electromigration of copper.

These objects are achieved by using a process where conductive pillars are created to form vias prior to the deposition of inter-metal dielectric (IMD). This is in contrast to the conventional process where the IMD is first deposited followed by etching of via holes and filling the via holes with conductive metal.

In the present invention, a first conductive layer is deposited overlying a substrate containing devices, junctions and other structures formed in previous process steps covered by an insulating layer. A conductive etch stop layer is deposited overlying the first conductive layer and then patterned to form a mask for the first conductive layer. This is followed by a deposition of via metal layer overlying the entire surface.

A hard mask layer, such as silicon nitride (SiN) or silicon oxynitride (SiON), for example, is deposited and patterned to form the mask where via pillars are to be formed. Subsequent anisotropic etching forms the pillars in the via metal layer and openings in the first conductive layer.

An inter-metal dielectric (IMD) layer is deposited covering and filling both the openings in the first conductive layer and in between the via pillars. Chemical mechanical polishing (CMP) is then used to planarize the surface. The now smooth IMD layer is patterned using photoresist. Etching in the unprotected area of both the IMD and hard mask layer forms openings to the via pillars and single damascene trenches where second conductive layer lines will lie. These lines are formed by depositing the second conductive material overlying the IMD and filling the trenches followed by CMP to remove conductive material not in the trenches.

BRIEF DESCRIPTION OF THE DRAWINGS

In the accompanying drawings forming a material part of this description, there is shown.

DESCRIPTION OF THE PREFERRED EMBODIMENTS

Figure 1:
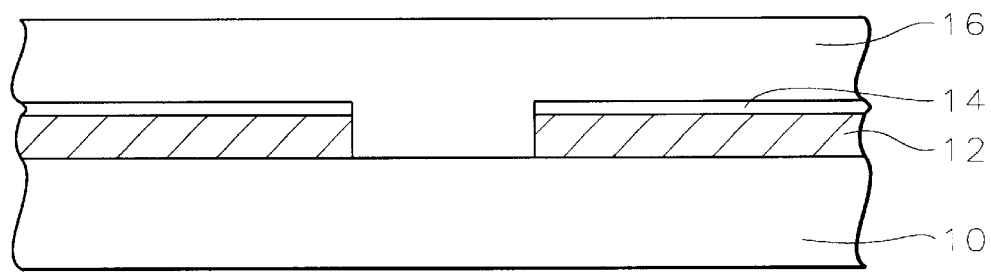
FIGS. 1 through 4 schematically illustrating in cross-sectional representation a prior art example of the dual damascene process.
Figure 2:
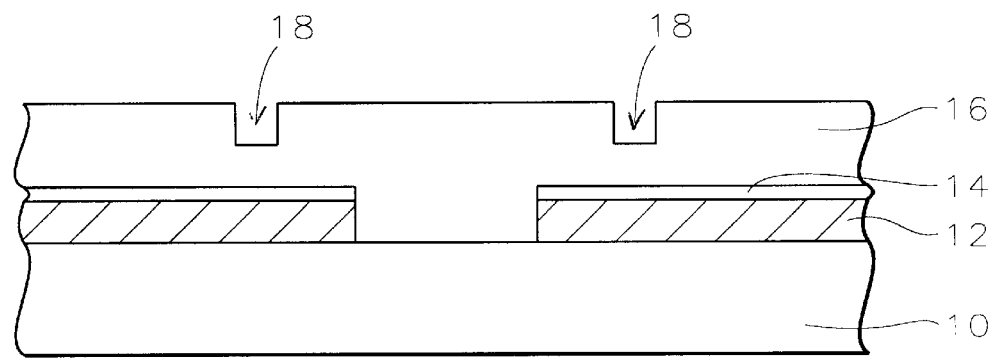
Figure 3:
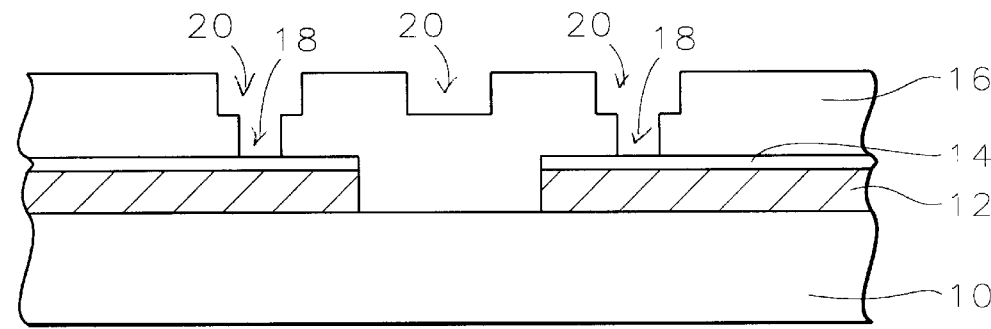
Figure 4:
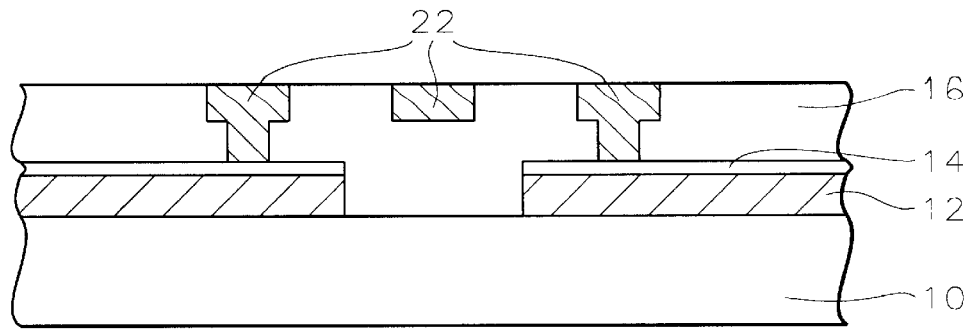
Figure 5:
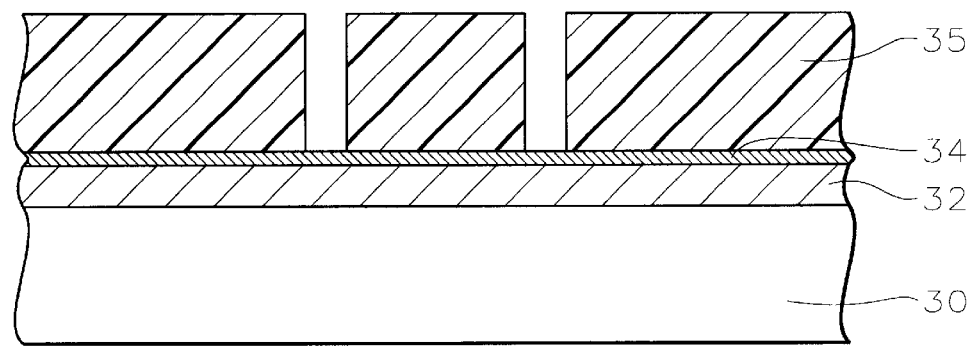
FIGS. 5 through 15 schematically illustrating in cross-sectional representation a preferred embodiment of the present invention.

Referring now to FIG. 5, a substrate 30 is provided. The substrate layer 30 may contain underlying layers, devices, junctions, and other features formed in earlier process steps covered by an insulating layer. A first conductive layer 32 composed of a conductor from a group containing aluminum (preferable), copper, gold or alloys of aluminum, copper and/or gold overlies the substrate 30. The first conductive layer 32 is deposited by conventional methods to a thickness of between about 2000 to 8000 Angstroms. This is followed by a conductive etch stop layer 34 deposition composed of tungsten nitride (WN), titanium nitride (TiN), or tantalum nitride (TaN) by conventional methods to a thickness of between about 100 to 600 Angstroms. A layer of photoresist is coated overlying the conductive etch stop layer 34. A photomask, not shown, is positioned over the photoresist. The photoresist is then exposed using actinic light using I-line photolithography, for example, and then developed to leave a photoresist mask 35, as shown in FIG. 5.

Figure 6:
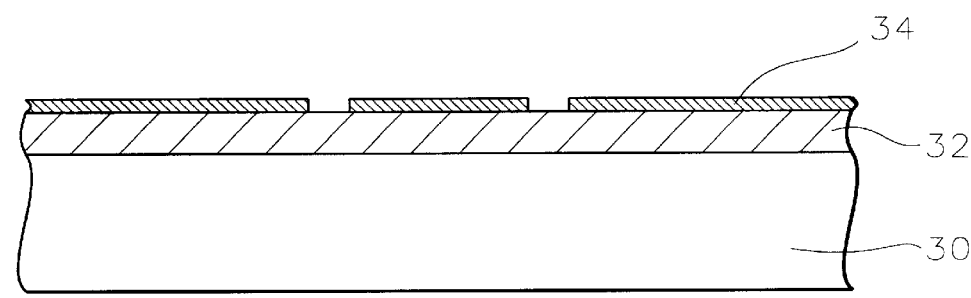

The conductive etch stop layer 34 then etched in the areas not protected by the photoresist mask 35 by conventional methods forming what will eventually be used as a protective mask for the first conductive layer 32 as shown in FIG. 6. The photoresist mask 35 is then stripped away.

Figure 7:
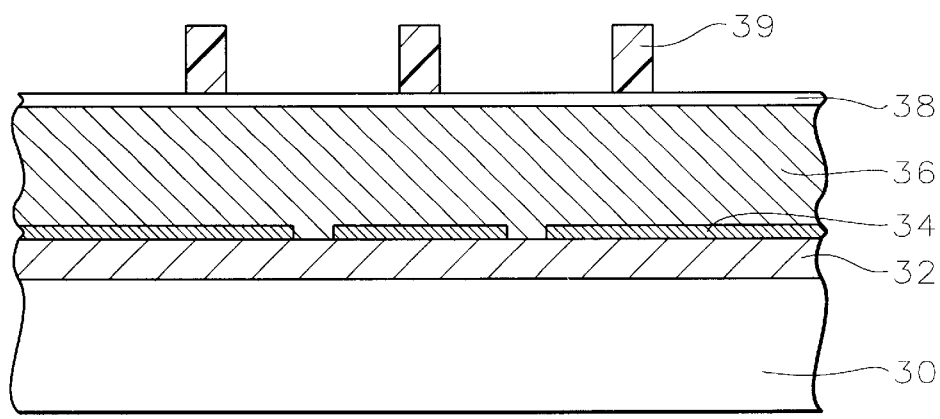

Referring now to FIG. 7, a via metal layer 36 composed of a conductor from a group containing aluminum (preferable), copper, gold or alloys of aluminum, copper and/or gold is deposited. It should be noted that the via layer 36 need not be the same material as the first conductive layer. The via metal layer 36 is deposited to a thickness of between about 2000 to 8000 Angstroms by conventional methods. A hard mask layer 38 composed of silicon nitride (SiN) or silicon oxynitride (SiON) is deposited overlying the via metal layer 36 to a thickness of between about 300 to 800 Angstroms by conventional methods. The hard mask layer 38 is coated with a layer of photoresist. After being positioned over the photoresist, a photomask, not shown, is used to expose the photoresist using actinic light using I-line photolithography, for example. As shown in FIG. 7, the photoresist is then developed leaving a photoresist mask 39.

Figure 8:
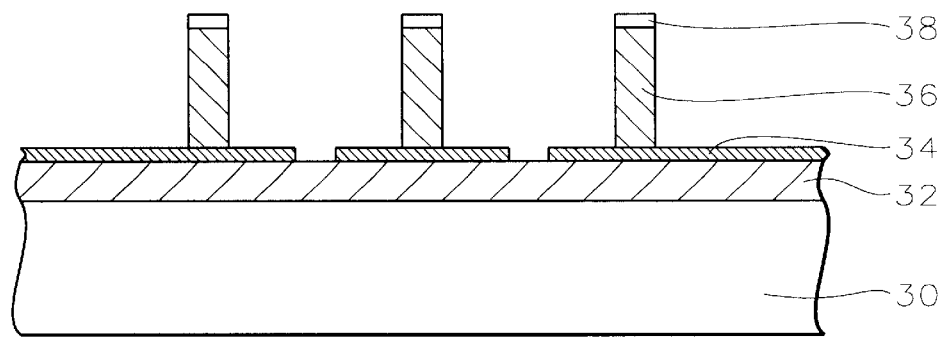
Figure 9:
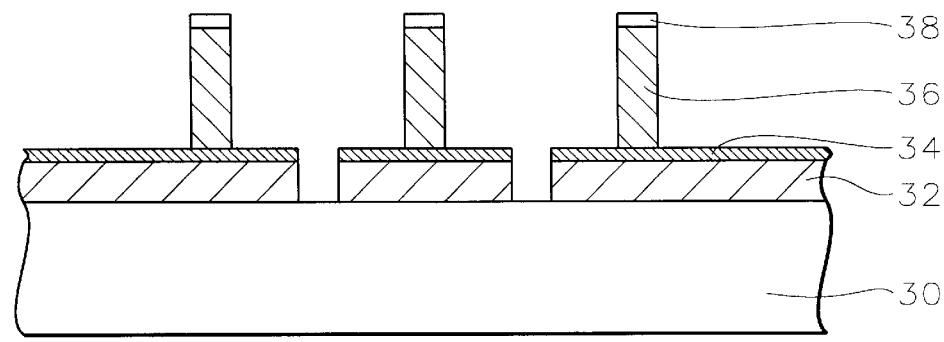

The hard mask layer 38 is etched in the areas not protected by the photoresist mask 39 using conventional techniques. Thereafter, the photoresist mask 39 is stripped away. The via metal layer 36 is then anisotropically etched to expose the conductive etch stop layer 34 and the first conductive layer 32 thus forming the via pillars as shown in FIG. 8. The via pillars may be 0.12 $\mu$m to 0.20 $\mu$m in width which is narrower than the conventional dual damascene processes. The via pillars may be as high as 10,000 Angstroms, which is taller than conventional vias. The anisotropic etch is continued into the first conductive layer 32 in the areas not protected by the conductive etch stop layer 34 exposing a portion of the substrate 30. This forms the openings in the first conductive layer 32 as shown in FIG. 9.

Figure 10:
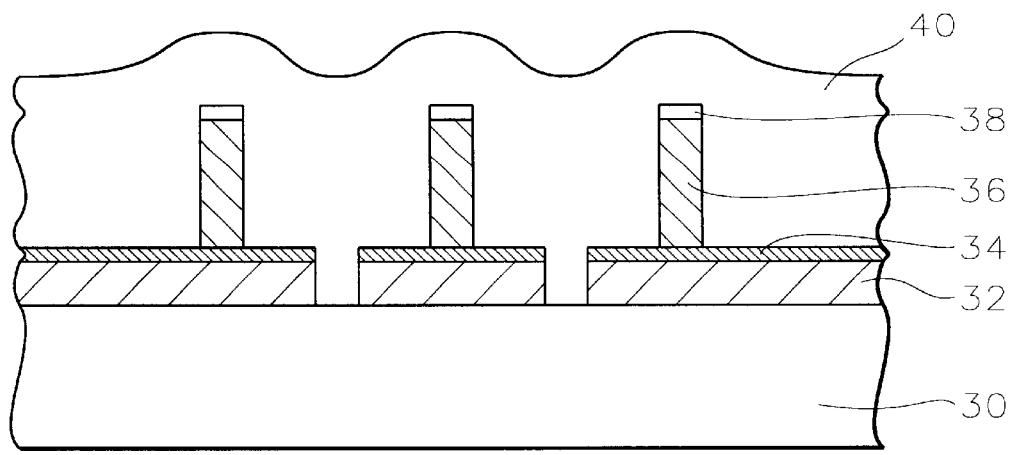

Referring now to FIG. 10, an inter-metal dielectric (IMD) layer 40 composed of one or more of a group containing high-density plasma (HDP), tetraethyl-oxysilane (TEOS), and fluorinated silicate glass (FSG) is deposited overlying all surfaces to a thickness of between about 10,000 to 30,000 Angstroms by conventional methods.

Figure 11:
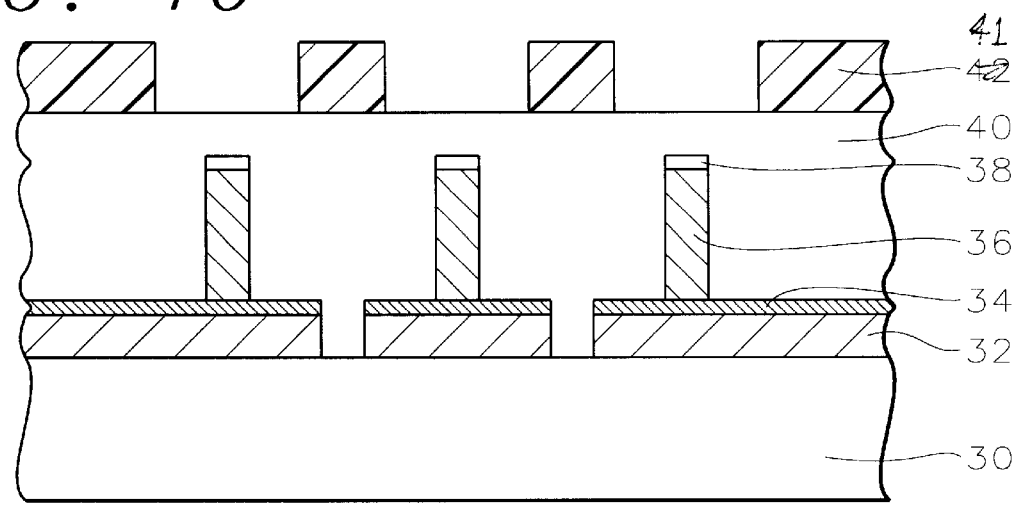

The IMD layer 40 is then planarized using chemical mechanical polishing (CMP), for example. This process also prescribes the final thickness of the IMD layer 40 and the desired second conductive layer (formed later) thickness. The second conductive layer thickness will become the thickness of the IMD) layer 40 over the via pillars. The IMD layer 40 is coated with a layer of photoresist. The layer of photoresist is then exposed through a photomask, not shown, placed above the photoresist using actinic fight using I-line photolithography, for example. The photoresist is then developed leaving a photoresist mask 41, as shown in FIG. 11.

Figure 12:
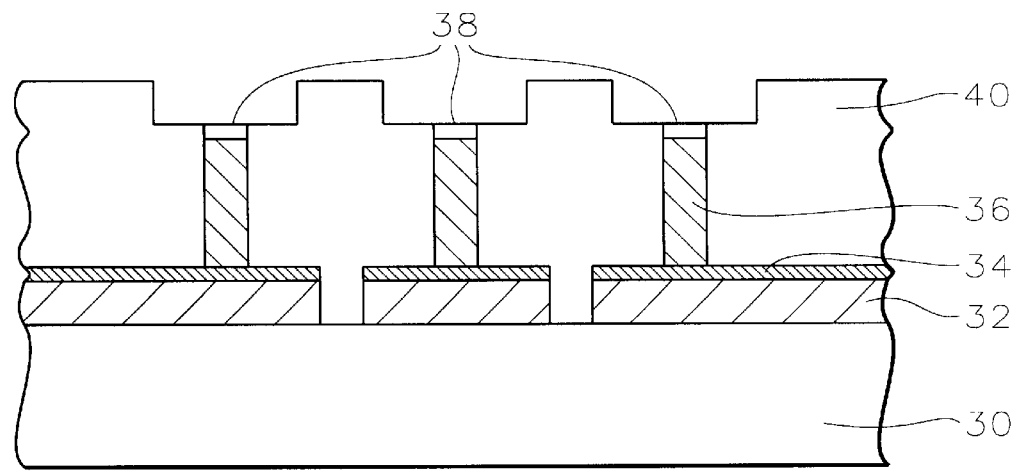

Referring now to FIG. 12, the IMD layer 40 is conventionally etched to expose the hard mask layer 38 in the areas not protected by the photoresist mask 41 forming the single damascene trenches in the IMD layer 40. The photoresist mask 41 is then stripped away.

Figure 13:
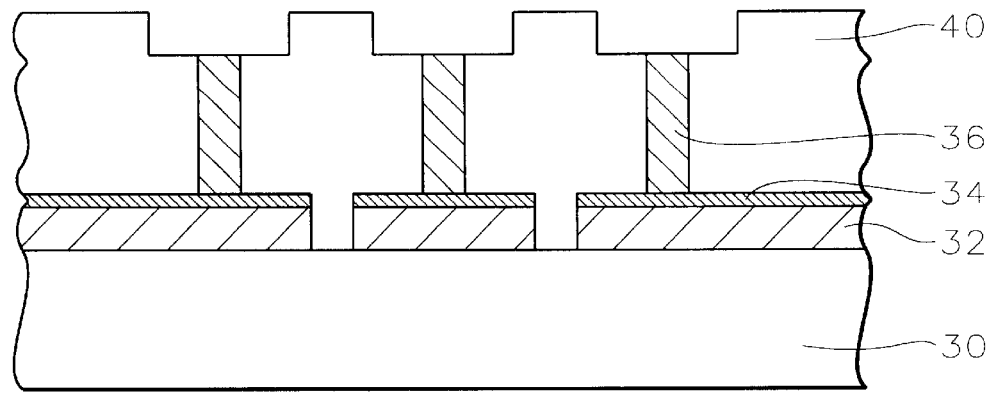

Referring now to FIG. 13, the hard mask layer 38 is removed by a dry overetch process, thereby exposing the tops of the pillars formed in the via metal layer 36.

Figure 14:
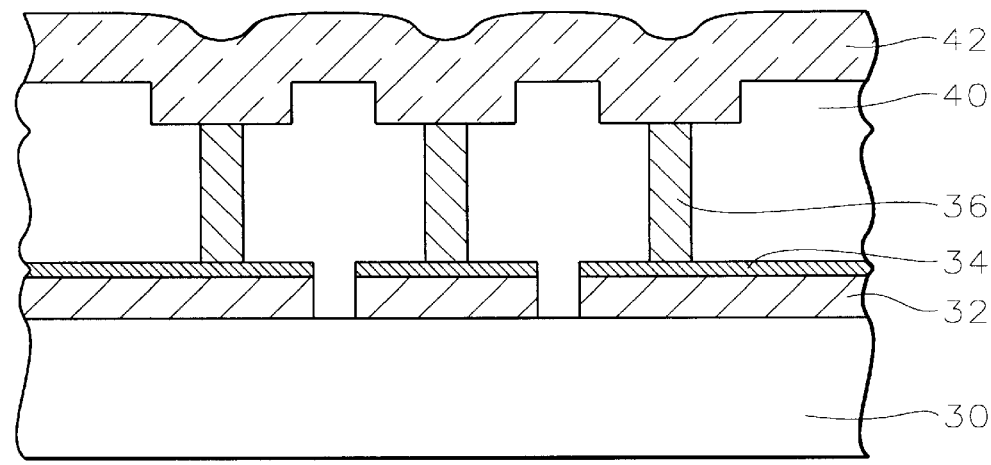

Referring now to FIG. 14, a second conductive layer 42 composed of a conductor from a group containing aluminum, copper, gold or alloys of aluminum, copper and/or gold, for example, is then deposited overlying the IMD layer 40 and filling the trenches. The second conductive layer 42 does not need to be the same as the via metal layer 36. The second conductive layer 42 is deposited to a thickness of between about 2000 to 8000 Angstroms by conventional methods.

Figure 15:
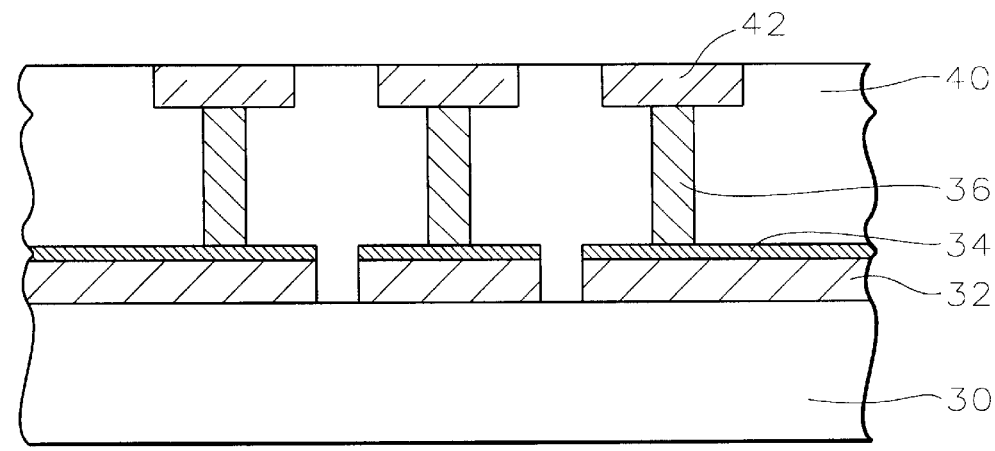

Referring now to FIG. 15, CMP is then used to remove the second conductive layer 42 not inside the trenches.

In the present invention, a pillar inter-level metalization process has been described. Etching metal to form conductive pillars is more effective than etching small, deep via holes. The problems associated with etching via holes though the IMD and filling the holes are eliminated thus providing a reliable interlevel conductor connection. In addition, problems of varying IMD etch rates in areas of dense via population are not encountered. The present invention uses a hard mask layer to protect the via metal layer during IMD etching while providing an etch endpoint. The number of process steps is reduced over previous techniques (such as the separate via, etch-stop and metal etches required in Lui et al.), and requires only one IMD and CMP step. Finally, this process allows the use of copper interconnection reducing both interconnection resistance and electromigration.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit multilevel interconnection comprising:

providing an insulating layer overlying semiconductor device structures in and on a semiconductor substrate;

depositing a first conductive layer overlying said insulating layer;

depositing a conductive etch stop layer overlying said first conductive layer;

patterning said conductive etch stop layer to form openings to said first conductive layer;

depositing a via metal layer overlying said conductive etch stop layer and said first conductive layer within said openings;

depositing a hard mask layer overlying said via metal layer;

patterning said hard mask layer to form openings to said via metal layer;

anisotropically etching said via metal layer not covered by said hard mask layer to said conductive etch stop layer and said first conductive layer not protected by said conductive etch stop layer thereby forming pillars in said via metal layer;

anisotropically etching said first conductive layer not covered by said conductive etch stop layer to said insulating layer thereby creating a first trench in said first conductive layer;

depositing an inter-metal dielectric layer covering said pillars and said hard mask layer and filling said first trench;

planarizing said inter-metal dielectric layer;

thereafter patterning said inter-metal dielectric layer to form second trenches in said inter-metal dielectric layer wherein each second trench overlies one of said pillars;

etching away said hard mask layer within said second trenches thereby exposing the tops of said pillars;

thereafter depositing a second conductive layer within said second trenches; and planarizing said second conductive layer to a surface of said inter-metal dielectric layer thereby forming conductive traces comprising said pillars and overlying second conductive layer-filled second trenches to complete fabrication of said integrated circuit multilevel interconnection.

2. The method according to claim 1 wherein said first conductive layer is selected from the group consisting of aluminum, copper, gold and alloys of aluminum, copper, and gold deposited to a thickness of between about 2000 to 8000 Angstroms.

3. The method according to claim 1 wherein said conductive etch stop layer is selected from the group consisting of tungsten nitride (WN), titanium nitride(TiN), and tantalum nitride (TaN) deposited to a thickness of between about 100 to 600 Angstroms.

4. The method according to claim 1 wherein said via metal layer is selected from the group consisting of aluminum, copper, gold and alloys of aluminum, copper, and gold deposited to a thickness of between about 2000 to 8000 Angstroms.

5. The method according to claim 1 wherein said hard mask layer is selected from the group consisting of silicon nitride (SiN), and silicon oxynitride (SiON) deposited to a thickness of between about 300 to 800 Angstroms.

6. The method according to claim 1 wherein said inter-metal dielectric layer is selected from the group consisting of high-density plasma (HDP), tetraethyl-oxysilane (TEOS), and fluorinated silicate glass (FSG) to a thickness of between about 10,000 to 30,000 Angstroms.

7. The method according to claim 1 wherein said planarization of said inter-metal dielectric layer is accomplished by chemical mechanical polishing (CMP).

8. The method according to claim 1 wherein said second conductive layer is selected from the group consisting of aluminum, copper, gold and alloys of aluminum, copper, and gold deposited to a thickness of between about 2000 to 8000 Angstroms.

9. The method according to claim 1 wherein said planarization of said second conductive layer is accomplished by chemical mechanical polishing (CMP).

10. A method of fabricating an integrated circuit multi-level interconnection comprising:

providing an insulating layer overlying semiconductor device structures in and on a semiconductor substrate;

depositing a first conductive layer overlying said insulating layer;

depositing a conductive etch stop layer overlying said first conductive layer;

patterning said conductive etch stop layer to form openings to said first conductive layer;

depositing a via metal layer overlying said conductive etch stop layer and said first conductive layer within said openings;

depositing a hard mask layer composed of one of a group containing silicon nitride (SiN), and silicon oxynitride (SiON) deposited to a thickness of between about 300 to 800 Angstroms overlying said via metal layer;

patterning said hard mask layer to form a openings to said via metal layer;

anisotropically etching said via metal layer not covered by said hard mask layer to said conductive etch stop layer and said first conductive layer not protected by said conductive etch stop layer thereby forming pillars in said via metal layer;

anisotropically etching said first conductive layer not covered by said conductive etch stop layer to said insulating layer thereby creating a first trench in said first conductive layer;

depositing an inter-metal dielectric layer covering said pillars and said hard mask layer and filling said first trench;

planarizing said inter-metal dielectric layer;

thereafter patterning said inter-metal dielectric layer to form second trenches in said inter-metal dielectric layer wherein each second trench overlies one of said pillars;

etching away said hard mask layer within said second trenches thereby exposing the tops of said pillars;

thereafter depositing a second conductive layer within said second trenches; and planarizing said second conductive layer to a surface of said inter-metal dielectric layer thereby forming conductive traces comprising said pillars and overlying second conductive layer-filled second trenches to complete fabrication of said integrated circuit multilevel interconnection.

11. The method according to claim 10 wherein said first conductive layer is selected from the group consisting of aluminum, copper, gold and alloys of aluminum, copper, and gold deposited to a thickness of between about 2000 to 8000 Angstroms.

12. The method according to claim 10 wherein said conductive etch stop layer is selected from the group consisting of tungsten nitride (WN), titanium nitride (TiN), and tantalum nitride (TaN) deposited to a thickness of between about 100 to 600 Angstroms.

13. The method according to claim 10 wherein said via metal layer is selected from the group consisting of aluminum, copper, gold and alloys of aluminum, copper, and gold deposited to a thickness of between about 2000 to 8000 Angstroms.

14. The method according to claim 10 wherein said inter-metal dielectric layer is selected from the group consisting of high-density plasma (HDP), tetraethyl-oxysilane (TEOS), and fluorinated silicate glass (FSG) to a thickness of between about 10,000 to 30,000 Angstroms.

15. The method according to claim 10 wherein said planarization of said inter-metal dielectric layer is accomplished by chemical mechanical polishing (CMP).

16. The method according to claim 10 wherein said second conductive layer is selected from the group consisting of aluminum, copper, gold and alloys of aluminum, copper, and gold deposited to a thickness of between about 2000 to 8000 Angstroms.

17. The method according to claim 10 wherein said planarization of said second conductive layer is accomplished by chemical mechanical polishing (CMP).

18. A method of fabricating an integrated circuit multilevel interconnection comprising:

providing an insulating layer overlying semiconductor device structures in and on a semiconductor substrate;

depositing a first conductive layer overlying said insulating layer;

depositing a conductive etch stop layer composed of one of a group containing tungsten nitride (WN), titanium nitride(TiN), and tantalum nitride (TaN) deposited to a thickness of between about 100 to 600 Angstroms overlying said first conductive layer;

patterning said conductive etch stop layer to form openings to said first conductive layer;

depositing a via metal layer overlying said conductive etch stop layer and said first conductive layer within said openings;

depositing a hard mask layer composed of one of a group containing silicon nitride (SiN), and silicon oxynitride (SiON) deposited to a thickness of between about 300 to 800 Angstroms overlying said via metal layer;

patterning said hard mask layer to form openings to said via metal layer;

anisotropically etching said via metal layer not covered by said hard mask layer to said conductive etch stop layer and said first conductive layer not protected by said conductive etch stop layer thereby forming pillars in said via metal layer;

anisotropically etching said first conductive layer not covered by said conductive etch stop layer to said insulating layer thereby creating a first trench in said first conductive layer;

depositing an inter-metal dielectric layer covering said pillars and said hard mask layer and filling said first trench;

planarizing said inter-metal dielectric layer;

thereafter patterning said inter-metal dielectric layer to form second trenches in said inter-metal dielectric layer wherein each second trench overlies one of said pillars;

etching away said hard mask layer within said second trenches thereby exposing the tops of said pillars;

thereafter depositing a second conductive layer within said second trenches; and planarizing said second conductive layer to a surface of said inter-metal dielectric layer thereby forming conductive traces comprising said pillars and overlying second conductive layer-filled second trenches to complete fabrication of said integrated circuit multilevel interconnection.

19. The method according to claim 18 wherein said first conductive layer is selected from the group consisting of aluminum, copper, gold and alloys of aluminum, copper, and gold deposited to a thickness of between about 2000 to 8000 Angstroms.

20. The method according to claim 18 wherein said via metal layer is selected from the group consisting of aluminum, copper, gold and alloys of aluminum, copper, and gold deposited to a thickness of between about 2000 to 8000 Angstroms.

21. The method according to claim 18 wherein said inter-metal dielectric layer is selected from the group consisting of high-density plasma (HDP), tetraethyl-oxysilane (TEOS), and fluorinated silicate glass (FSG) to a thickness of between about 10,000 to 30,000 Angstroms.

22. The method according to claim 18 wherein said planarization of said inter-metal dielectric layer is accomplished by chemical mechanical polishing (CMP).

23. The method according to claim 18 wherein said second conductive layer is selected from the group consisting of aluminum, copper, gold and alloys of aluminum copper, and gold deposited to a thickness of between about 2000 to 8000 Angstroms.

24. The method according to claim 18 wherein said planarization of said second conductive layer is accomplished by chemical mechanical polishing (CMP).

* * * * *